United States Patent
Kikuchi et al.

(10) Patent No.: US 11,733,434 B2
(45) Date of Patent: Aug. 22, 2023

(54) OPTICAL COMPONENT AND TRANSPARENT SEALING MEMBER

(71) Applicant: NGK Insulators, Ltd., Nagoya (JP)

(72) Inventors: Yoshio Kikuchi, Nagoya (JP); Makoto Iwai, Kasugai (JP)

(73) Assignee: NGK INSULATORS, LTD., Nagoya (JP)

( * ) Notice: Subject to any disclaimer, the term of this patent is extended or adjusted under 35 U.S.C. 154(b) by 246 days.

(21) Appl. No.: 16/801,691

(22) Filed: Feb. 26, 2020

(65) Prior Publication Data

US 2020/0192003 A1 Jun. 18, 2020

Related U.S. Application Data

(63) Continuation of application No. PCT/JP2017/031211, filed on Aug. 30, 2017.

(51) Int. Cl.
*G02B 1/14* (2015.01)
*H01L 33/58* (2010.01)
*H01L 33/48* (2010.01)

(52) U.S. Cl.
CPC .............. *G02B 1/14* (2015.01); *H01L 33/483* (2013.01); *H01L 33/58* (2013.01); *H01L 2933/0058* (2013.01)

(58) Field of Classification Search
CPC .............................. H01L 33/483; H01L 33/58
See application file for complete search history.

(56) References Cited

U.S. PATENT DOCUMENTS

| 2011/0019960 A1* | 1/2011 | Matsubara | G02B 6/125 385/14 |
| 2014/0014995 A1* | 1/2014 | Pindl | H01L 33/483 438/27 |
| 2015/0062872 A1* | 3/2015 | Song | G02B 5/021 362/97.1 |
| 2017/0069801 A1* | 3/2017 | Oka | H01L 33/486 |

FOREIGN PATENT DOCUMENTS

| JP | 2005-322680 A1 | 11/2005 |
| JP | 2006-093372 A  | 4/2006  |
| JP | 2014-216484 A  | 11/2014 |

(Continued)

OTHER PUBLICATIONS

Japanese Office Action (Application No. 2019-538829) dated Aug. 3, 2021 (with English translation).

(Continued)

*Primary Examiner* — Jay C Chang
*Assistant Examiner* — Mikka Liu
(74) *Attorney, Agent, or Firm* — Burr Patent Law, PLLC

(57) ABSTRACT

The present invention relates to an optical component and a transparent sealing member. An optical component has: at least one optical element; and a package that houses therein the optical element. The package has: a mounting board on which the optical element is mounted; a transparent sealing member bonded on the mounting board; a recessed section surrounding the optical element mounted on the mounting board; and a refractive index matching agent applied to the inside of the recessed section. The package has at least one groove in communication with the outside from the recessed section.

16 Claims, 11 Drawing Sheets

(56) References Cited

FOREIGN PATENT DOCUMENTS

| JP | 2014-216532 | A1 |   | 11/2014 |
|----|-------------|----|---|---------|
| JP | 2014216484  | A  | * | 11/2014 |
| JP | 2017-011200 | A1 |   | 1/2017  |
| JP | 2017-054894 | A  |   | 3/2017  |

OTHER PUBLICATIONS

English Translation of International Preliminary Report on Patentability (Chapter I) ( Application No. PCT/JP2017/031211) dated Mar. 12, 2020.
International Search Report and Written Opinion (Application No. PCT/JP2017/031211) dated Nov. 14, 2017.

* cited by examiner

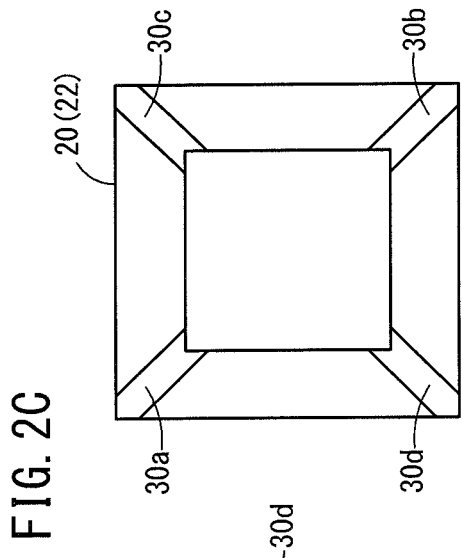
FIG. 2A
FIG. 2B
FIG. 2C
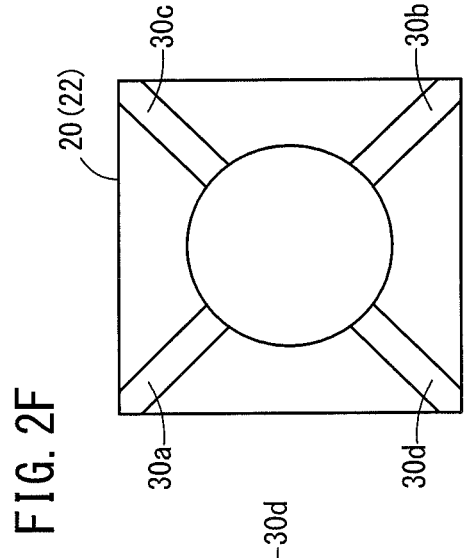
FIG. 2D
FIG. 2E
FIG. 2F

OPTICAL COMPONENT AND TRANSPARENT SEALING MEMBER

CROSS-REFERENCE TO RELATED APPLICATION

This application is a Continuation of International Application No. PCT/JP2017/031211 filed on Aug. 30, 2017, the contents all of which are incorporated herein by reference.

TECHNICAL FIELD

The present invention relates to an optical component and a transparent sealing member that is used in such an optical component, and for example, relates to an optical component and a transparent sealing member that are suitable for use with an LED (light emitting diode), an LD (semiconductor laser), or the like.

BACKGROUND ART

Recently, methods of using a light emitting element (ultraviolet LED) that emits ultraviolet rays for the purposes of sterilization and purification are becoming widespread. In such an ultraviolet LED device, a transparent sealing member is required in order to protect the light emitting element from the outside air and moisture. From the standpoints of permeability to ultraviolet rays and durability, glass or quartz glass is used as the transparent sealing member.

In Japanese Laid-Open Patent Publication No. 2014-216532, a semiconductor light emitting element package is disclosed having a non-light-transmitting substrate on which a semiconductor light emitting element is mounted on an upper surface thereof, and a concave portion that is opened downwardly, while in addition, the package includes a light transmissive protective member that surrounds the semiconductor light emitting element.

In Japanese Laid-Open Patent Publication No. 2017-011200, a semiconductor light emitting element package is disclosed having a light emitting element that emits ultraviolet light, a substrate on which the light emitting element is mounted, and a light transmissive protective member that covers the light emitting element and which transmits ultraviolet light, and in which the light emitting element is accommodated in a region (concave portion) formed by the substrate and the light transmissive protective member.

SUMMARY OF INVENTION

Incidentally, when an index of refraction of the light transmissive protective member differs significantly from the index of refraction of the concave portion, there is a concern that the light emitted from the semiconductor light emitting element may be surface reflected by the surface of the light transmissive protective member. Thus, it may be considered to fill the concave portion with a refractive index matching agent having an index of refraction between the index of refraction of the light transmissive protective member and the index of refraction of the concave portion. However, at a time when the semiconductor light emitting element package is assembled, air bubbles enter and become mixed within the refractive index matching agent, and a problem arises in that the effect produced by the refractive index matching agent (suppression of surface reflection) cannot be sufficiently exhibited.

The present invention has been devised taking into consideration the aforementioned problems, and has the object of providing an optical component and a transparent sealing member, in which entry and mixing of the air bubbles within the refractive index matching agent can be suppressed, the advantageous effect of the refractive index matching agent (suppression of surface reflection) can be realized, and the performance of the optical component can be enhanced.

[1] An optical component according to a first aspect of the present invention comprises at least one optical element, and a package in which the optical element is accommodated, the package including a mounting substrate on which the optical element is mounted, a transparent sealing member bonded on the mounting substrate, a concave portion surrounding the optical element that is mounted on the mounting substrate, and a refractive index matching agent filled inside the concave portion, wherein the package includes at least one groove configured to communicate with an exterior from the concave portion. The concave portion may be provided in the transparent sealing member or may be provided in the mounting substrate.

When the index of refraction of the light transmitting protective member differs significantly from the index of refraction of the concave portion (the space in which the optical element is accommodated), there is a concern that the light emitted from the optical element may be surface reflected by the surface of the light transmissive protective member. Therefore, according to the present invention, the refractive index matching agent is filled inside the concave portion. The refractive index matching agent has an index of refraction between the index of refraction of the transparent sealing member and the index of refraction of the concave portion (the space in which the optical element is accommodated). Furthermore, in the present invention, at least one groove that communicates with the exterior from the concave portion is provided in the package.

In the case of assembling the optical component, for example, the refractive index matching agent is filled inside the concave portion of the transparent sealing member. Thereafter, the mounting substrate on which the optical element is mounted and the transparent sealing member are bonded to each other. In this case, such bonding is carried out in a manner so that the optical element becomes buried within the concave portion in which the refractive index matching agent is filled. At the time of such bonding, a portion of the refractive index matching agent becomes discharged to the exterior through the groove, and escape of the air bubbles to the exterior also occurs.

More specifically, in the present invention, entry and mixing of the air bubbles within the refractive index matching agent can be suppressed, and the advantageous effect of the refractive index matching agent (suppression of surface reflection) can be realized, together with enabling an enhancement in the performance of the optical component.

[2] In the first aspect of the present invention, the groove may be formed in a portion within the transparent sealing member, the portion being bonded to the mounting substrate.

[3] In the first aspect of the present invention, the groove may be formed in at least a portion within the mounting substrate, the portion being bonded to the transparent sealing member.

[4] In the first aspect of the present invention, a plurality of the grooves may be included, and the plurality of grooves may be formed radially. In accordance with this feature, when the transparent sealing member and the mounting substrate are bonded to each other, the portion of the refractive index matching agent is easily discharged to the exterior through the grooves, and escape of the air bubbles to the exterior is also easily carried out.

[5] In the first aspect of the present invention, a step configured to communicate with the concave portion may be formed around a periphery of the concave portion, within a portion where the transparent sealing member and the mounting substrate are bonded to each other. When the transparent sealing member and the mounting substrate are bonded to each other, the step serves as a passage through which the air bubbles are guided to the grooves, whereby it becomes possible for escape of the air bubbles to the exterior to be smoothly carried out.

[6] In the first aspect of the present invention, assuming that a projected area of a portion where the transparent sealing member and the mounting substrate are bonded to each other with respect to a bottom surface of the optical component is represented by A, and a projected area of the groove with respect to the bottom surface of the optical component is represented by B, then (B/A)×100 is preferably greater than or equal to 5% and less than or equal to 30%.

If the projected area of the groove is too large, the adhesive strength between the transparent sealing member and the mounting substrate becomes small, and it becomes easy for the transparent sealing member to come off or separate away from the mounting substrate. Conversely, if the projected area of the groove is too small, when the transparent sealing member and the mounting substrate are bonded to each other, it becomes difficult for the air bubbles to escape from the groove. Thus, the value of (B/A)×100 is preferably greater than or equal to 5% and less than or equal to 30%.

[7] In the first aspect of the present invention, a height of the groove is preferably smaller than a thickness of the optical element. If the height of the groove is too large, air bubbles will remain around the periphery of the optical element. Thus, the height of the groove is preferably smaller than the thickness of the optical element. Moreover, if the height of the groove is too small, when the transparent sealing member and the mounting substrate are bonded to each other, it becomes difficult for the air bubbles to escape from the groove. The height of the groove is preferably from 50 to 600 μm.

[8] In the first aspect of the present invention, the transparent sealing member is preferably made of quartz glass or optical glass, and the refractive index matching agent is preferably a silicone resin or a fluorine resin.

[9] A transparent sealing member according to a second aspect of the present invention is used in an optical component comprising at least one optical element, a mounting substrate on which the optical element is mounted, and a concave portion surrounding the optical element that is mounted on the mounting substrate, the transparent sealing member constituting a package in which the optical element is accommodated together with the mounting substrate. In addition, the transparent sealing member is bonded to the mounting substrate in a state with a refractive index matching agent being filled in the concave portion, and includes, in a portion that is bonded to the mounting substrate, at least one groove configured to communicate with an exterior from the concave portion.

[10] In the second aspect of the present invention, a plurality of the grooves may be included, and the plurality of grooves may be formed radially.

[11] In the second aspect of the present invention, a step configured to communicate with the concave portion may be formed around a periphery of the concave portion, within a portion where the transparent sealing member is bonded to the mounting substrate.

[12] In the second aspect of the present invention, assuming that a projected area of a portion where the transparent sealing member is bonded to the mounting substrate with respect to a bottom surface of the optical component is represented by A, and a projected area of the groove with respect to the bottom surface of the optical component is represented by B, then (B/A)×100 is preferably greater than or equal to 5% and less than or equal to 30%.

[13] In the second aspect of the present invention, a height of the groove is preferably smaller than a thickness of the optical element.

[14] In the second aspect of the present invention, the transparent sealing member is preferably made of quartz glass or optical glass, and the refractive index matching agent is preferably a silicone resin or a fluorine resin.

As described above, in accordance with the optical component and the transparent sealing member according to the present invention, entry and mixing of the air bubbles within the refractive index matching agent can be suppressed, the advantageous effect of the refractive index matching agent (suppression of surface reflection) can be realized, and the performance of the optical component can be enhanced.

BRIEF DESCRIPTION OF DRAWINGS

FIGS. 2A to 2F are plan views showing examples in which a plurality of grooves are formed radially in a pedestal of a transparent sealing member;

DESCRIPTION OF EMBODIMENTS

Exemplary embodiments of an optical component and a transparent sealing member according to the present invention will be presented and described below with reference to FIGS. 1 to 11B.

Figure 1:
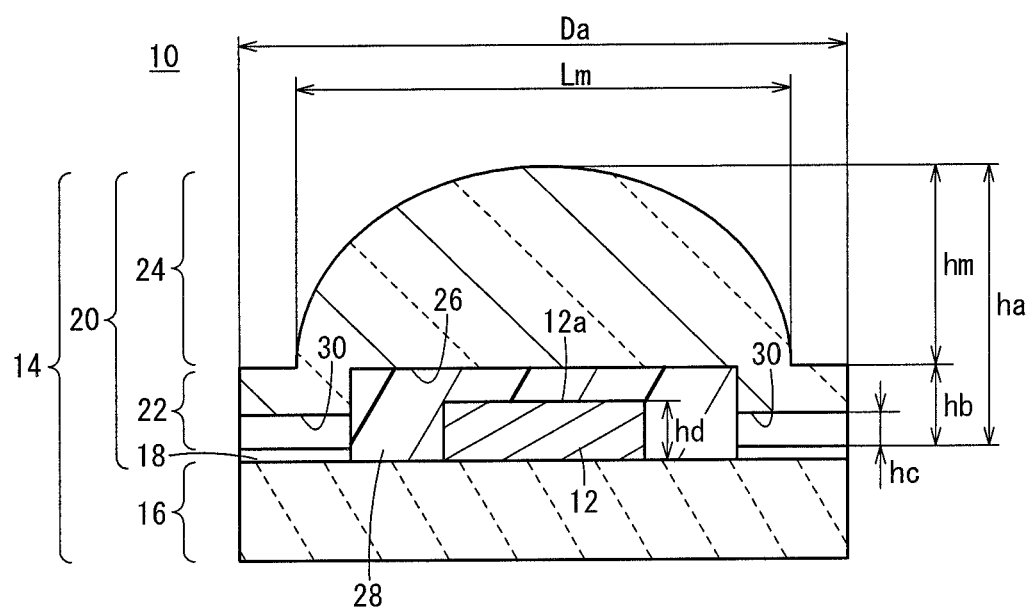
FIG. 1 is a vertical cross-sectional view showing an optical component according to an embodiment.

As shown in FIG. 1, an optical component 10 according to the present embodiment includes at least one optical element 12 that emits ultraviolet light, and a package 14 in which the optical element 12 is accommodated. The package 14 includes a mounting substrate 16 on which the optical element 12 is mounted, and a transparent sealing member 20 joined to the mounting substrate 16 via, for example, an organic adhesive layer 18. The mounting substrate 16 is made of AlN (aluminum nitride), for example. The transparent sealing member 20 is made of quartz glass or optical glass, for example. As the adhesive layer 18, an epoxy-based adhesive, a silicone-based adhesive, a urethane-based adhesive, or the like can preferably be used.

As discussed above, the optical element 12 is mounted on the mounting substrate 16. Although not illustrated, the optical element 12 is configured, for example, by laminating a GaN-based crystalline layer having a quantum well structure on a sapphire substrate (coefficient of thermal expansion: $7.7 \times 10^{-6}/°$ C.). As a method of mounting the optical element 12, for example, a so-called face-up mounting method is adopted in which the light emitting surface 12a is mounted in facing relation to the transparent sealing member 20. More specifically, terminals (not shown) that are led out from the optical element 12, and circuit wirings (not shown) that are formed on the mounting substrate 16, for example, are electrically connected by bonding wires (not shown).

The transparent sealing member 20 includes an annular pedestal 22, which is arranged so as to surround the optical element 12 that is mounted on the mounting substrate 16 from the periphery thereof, and a lens body 24 that is integrally formed on the pedestal 22. Further, in the pedestal 22 of the transparent sealing member 20, a concave portion 26 (accommodating space) is formed having an opening on the lower surface thereof. At least the optical element 12 is accommodated in the concave portion 26.

The planar shape of the bottom surface of the lens body 24, for example, is of a circular shape, and the exterior shape of the pedestal 22, for example, is of a square shape. Of course, the planar shape of the bottom surface of the lens body 24 may be an elliptical shape, a track shape, or the like, and the exterior shape of the pedestal 22 may be a circular shape, or a polygonal shape such as a rectangular shape, a triangular shape, a hexagonal shape, or the like.

Concerning methods of manufacturing the transparent sealing member 20 having such a shape, there are (a) a process of being cut out from a bulk base material, (b) a high temperature molding process, and (c) a powder sintering method, etc.

In the cutting out process, a cutting out process from a bulk base material of the transparent sealing member 20 is carried out to thereby manufacture the transparent sealing member 20 as shown in FIG. 1. In the high temperature molding process, a material is poured into a mold at a high temperature, or a material piece is placed in the mold and is deformed in the mold at a high temperature, whereby the transparent sealing member 20 is manufactured as shown in FIG. 1.

In the powder sintering method, a molding slurry containing silica powder and an organic compound is cast into a molding die and solidified by a chemical reaction mutually with the organic compound, for example, a chemical reaction between a dispersion medium and a curing agent, or mutually with the curing agent, and thereafter, the solidified product is released from the mold, thereby producing a precursor of the transparent sealing member 20. Thereafter, the precursor is fired to manufacture the transparent sealing member 20 as shown in FIG. 1.

Concerning the dimensions of the transparent sealing member 20, a height ha of the transparent sealing member 20 is from 0.5 to 10 mm, an outer diameter Da of the pedestal 22 is from 3.0 to 10 mm, and a height hb of the pedestal 22 is from 0.2 to 1 mm. Concerning the lens body 24, a maximum length Lm at a bottom part thereof is 2.0 to 10 mm, a maximum height hm is 0.5 to 10 mm, and as an aspect ratio (hm/Lm) between such values, there may be mentioned a range from 0.3 to 1.0 or the like.

Furthermore, in the optical component 10, a refractive index matching agent 28 (liquid) is filled inside the concave portion 26 of the transparent sealing member 20, while additionally, a plurality of grooves 30 are formed in a portion within the transparent sealing member 20, the portion being bonded to the mounting substrate 16.

In the case that quartz glass or optical glass is used as the constituent material of the transparent sealing member 20, a fluorine resin, a silicone resin, or the like can preferably be adopted as the refractive index matching agent 28. Moreover, the index of refraction of air is 1, the index of refraction of quartz glass is from 1.57 (wavelength 185 nm) to 1.47 (wavelength 399 nm), the index of refraction of fluororesin is from 1.36 (wavelength 238 nm) to 1.35 (wavelength 407 nm), and the index of refraction of silicone resin is from 1.41 (wavelength 238 nm) to 1.57 (wavelength 589 nm).

The plurality of grooves 30, for example, as shown in FIGS. 2A to 2C, are formed radially. FIG. 2A shows an example in which two grooves 30a and 30b are formed on one straight line, and FIG. 2B shows an example in which four grooves 30a to 30d are formed respectively on two perpendicular straight lines. FIG. 2C shows an example in which four grooves 30a to 30d are formed respectively on two diagonal lines. Of course, the number of the grooves 30 and the radial directions (the directions in which the grooves 30 are formed) can be appropriately selected depending on the size and shape of the transparent sealing member 20.

In the examples described above, the planar shape of the concave portion 26 is rectangular; however, as shown in FIGS. 2D to 2F, the planar shape of the concave portion 26 may also be circular. In this case as well, the plurality of grooves 30 may be formed radially. Of course, the outer shape of the pedestal 22 may be circular and the planar shape of the concave portion may be rectangular, or both the outer shape of the pedestal 22 and the outer shape of the concave portion may be circular, and the planar shape of the concave portion may be rectangular.

The effects of the optical component 10 will be described herein while being compared with a first comparative example (Comparative Example 1) and a second comparative example (Comparative Example 2).

Figure 3A:
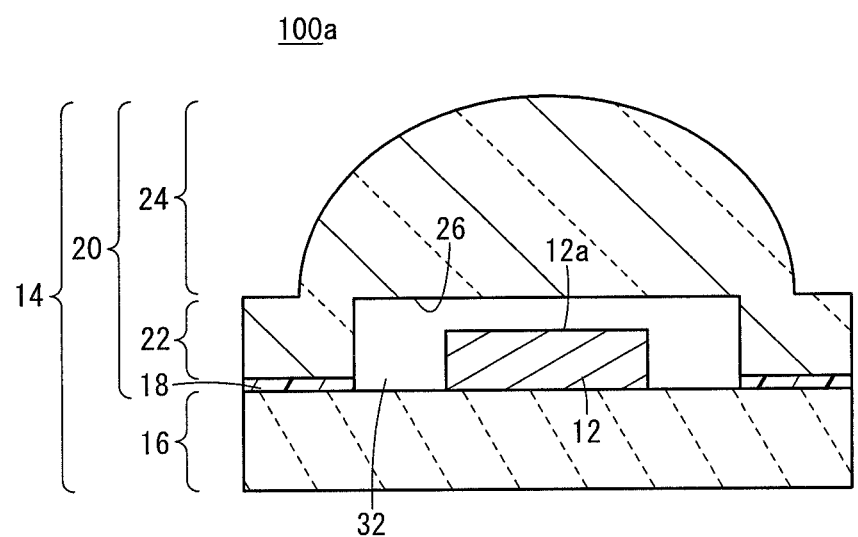
FIG. 3A is a vertical cross-sectional view illustrating a configuration of an optical component according to a first comparative example.

At first, as shown in FIG. 3A, although an optical component 100a according to Comparative Example 1 has substantially the same configuration as the optical component 10, the grooves 30 are not formed in the transparent sealing member 20, and further, the refractive index matching agent 28 is not filled inside the concave portion 26 of the transparent sealing member 20. More specifically, an air layer 32 is formed therein. Therefore, the index of refraction of the lens body 24 in the transparent sealing member 20 differs significantly from the index of refraction of the air layer 32 inside the concave portion 26, and the light emitted from the optical element 12 is surface reflected by the surface of the transparent sealing member 20. A loss due to such surface reflection is roughly 10%.

Figure 3B:
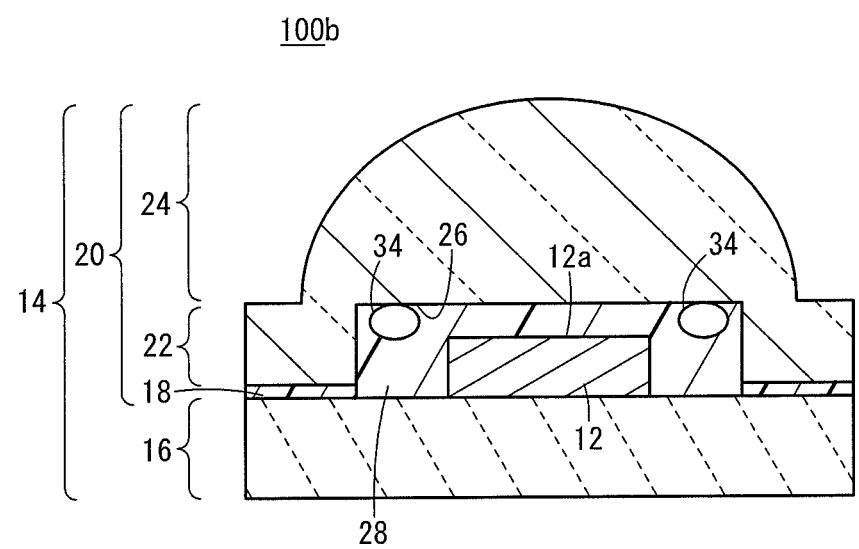
FIG. 3B is a vertical cross-sectional view illustrating a configuration of an optical component according to a second comparative example.

Next, as shown in FIG. 3B, in an optical component 100b according to Comparative Example 2, although the grooves 30 are not formed in the transparent sealing member 20, the refractive index matching agent 28 is filled inside the concave portion 26 of the transparent sealing member 20. However, a problem arises in that, when the optical component 100b is assembled, air bubbles 34 enter and become mixed therein.

Figure 4A:
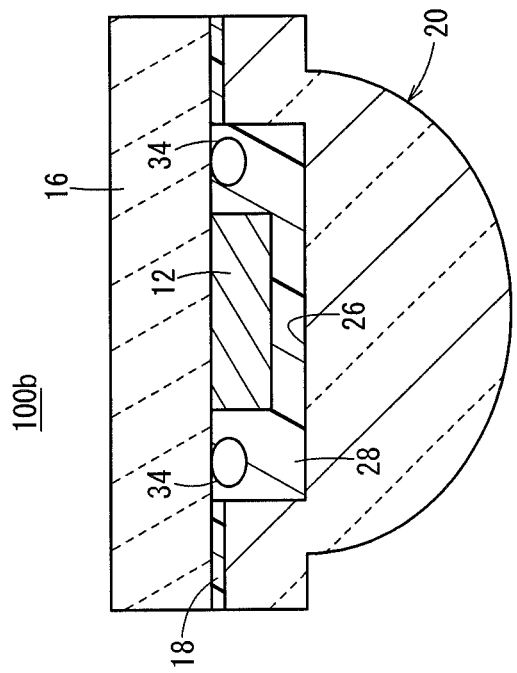
FIG. 4A is a process diagram showing a state in which a refractive index matching agent is filled inside a concave portion, in a state in which an opening of the concave portion is oriented upward in the optical component according to the second comparative example.
Figure 4B:
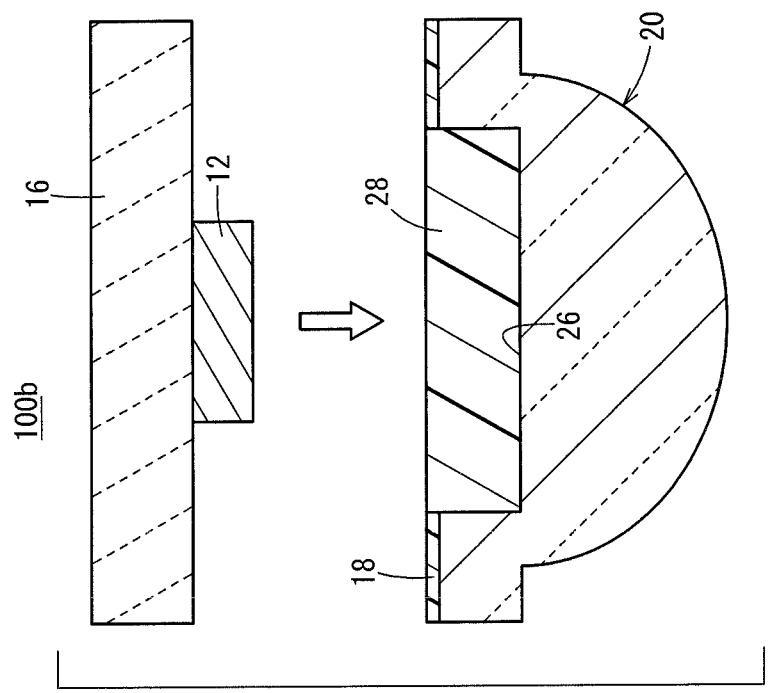
FIG. 4B is a process diagram showing a state in which a mounting substrate is bonded to the transparent sealing member with an optical element facing downward, so as to close the opening of the concave portion.

More specifically, as shown in FIG. 4A, the refractive index matching agent 28 is filled inside the concave portion 26 in a state in which the opening of the concave portion 26 is oriented upward. Thereafter, as shown in FIG. 4B, with the optical element 12 facing downward, the mounting substrate 16 is bonded to the transparent sealing member 20, so as to close the opening of the concave portion 26. When such bonding is performed, the air bubbles 34 enter and become mixed therein. Therefore, as shown in FIG. 3B, for example, at a time when the optical component 100b is used, when the air bubbles 34 move on the optical path, the effect produced by the refractive index matching agent 28 (suppression of surface reflection) cannot be sufficiently exhibited.

In contrast thereto, in the optical component 10 according to the present embodiment, as shown in FIG. 1, the refractive index matching agent 28 is filled inside the concave portion 26 of the transparent sealing member 20, while additionally, the plurality of grooves 30 are formed in the portion within the transparent sealing member 20, the portion being bonded to the mounting substrate 16.

Figure 5A:
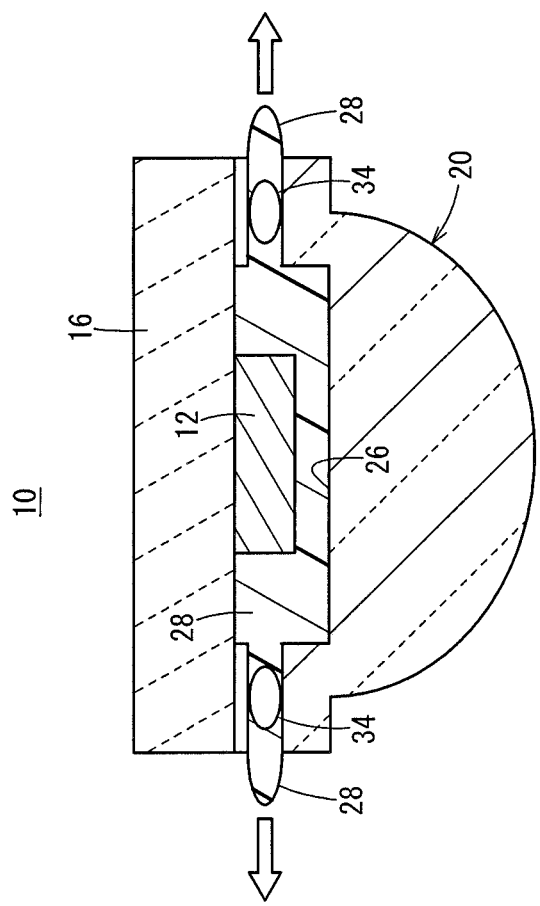
FIG. 5A is a process diagram showing a state in which a refractive index matching agent is filled inside a concave portion, in a state in which an opening of the concave portion is oriented upward in the optical component according to the present embodiment.
Figure 5B:
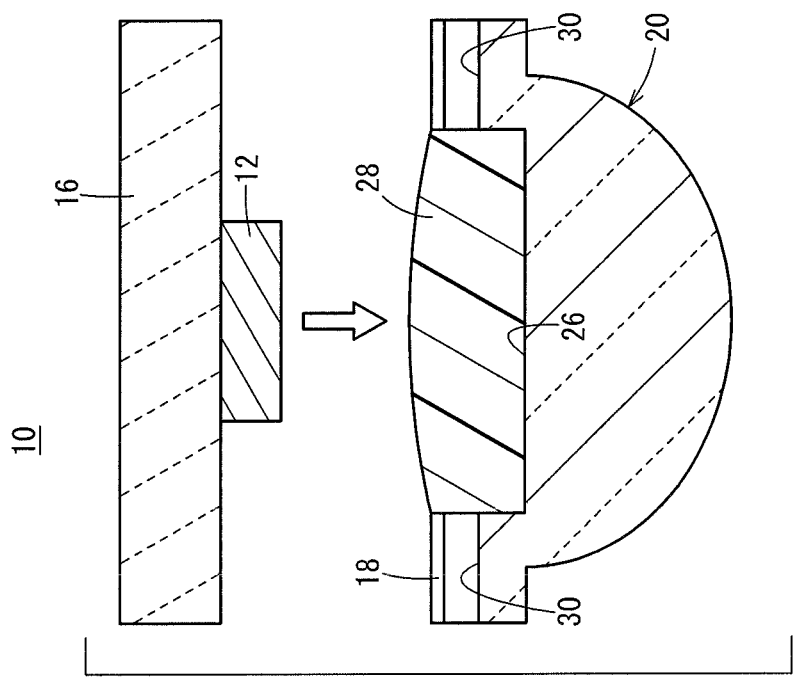
FIG. 5B is a process diagram showing a state in which a mounting substrate is bonded to the transparent sealing member with an optical element facing downward, so as to close the opening of the concave portion.
Figure 6A:
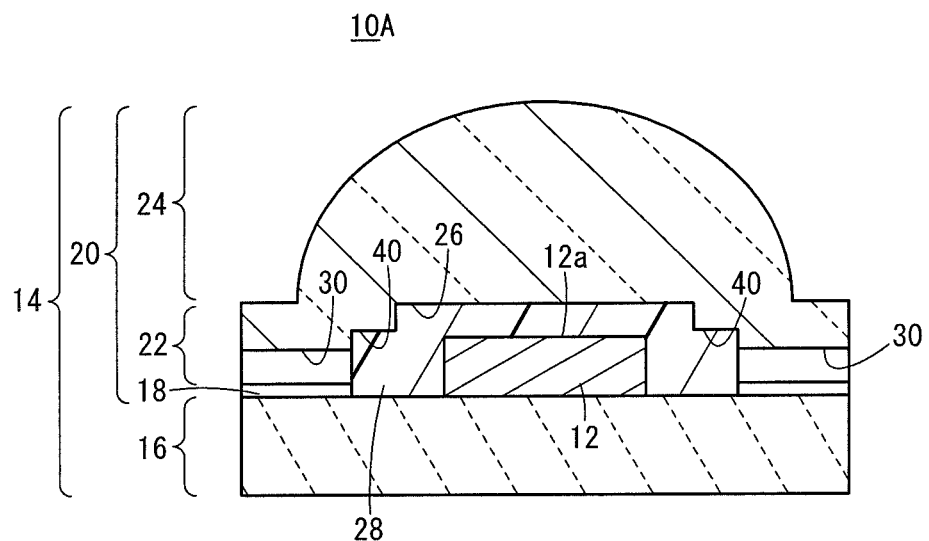
FIG. 6A is a vertical cross-sectional view showing a configuration of an optical component (first optical component) according to a first modification.
Figure 6B:
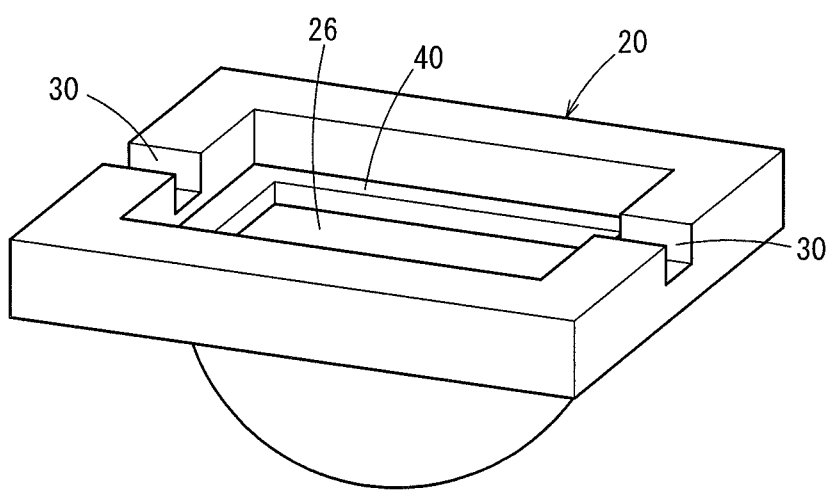
FIG. 6B is a perspective view showing an example of a bottom surface (bonding surface) of a transparent sealing member of the first optical component.

In assembling the optical component 10, similar to the aforementioned Comparative Example 2, as shown in FIG. 5A, the refractive index matching agent 28 is filled inside the concave portion 26 in a state with the opening of the concave portion 26 oriented upward. Thereafter, as shown in FIG. 5B, with the optical element 12 facing downward, the mounting substrate 16 is bonded to the transparent sealing member 20, so as to close the opening of the concave portion 26. In particular, with the optical component 10, when the aforementioned bonding is performed, a portion of the refractive index matching agent 28 (a portion corresponding to the volume of the optical element 12) becomes discharged to the exterior through the grooves 30, and escape of the air bubbles 34 to the exterior also occurs.

More specifically, in the optical component 10, as shown in FIG. 1, entry and mixing of the air bubbles 34 within the refractive index matching agent 28 can be suppressed, and the advantageous effect of the refractive index matching agent 28 (suppression of surface reflection) can be realized, together with enabling an enhancement in the performance of the optical component 10.

Further, as shown in FIGS. 2A to 2F, etc., in the optical component 10, the plurality of grooves 30 are formed radially. In accordance with this feature, when the transparent sealing member 20 and the mounting substrate 16 are bonded to each other, the portion of the refractive index matching agent 28 is easily discharged to the exterior through the grooves 30, and escape of the air bubbles 34 to the exterior is also easily carried out.

Within the transparent sealing member 20, assuming that a projected area at the portion bonded to the mounting substrate 16 with respect to the bottom surface of the optical component 10 (bottom surface of the mounting substrate 16) is represented by A, and a projected area of the grooves 30 with respect to the bottom surface of the optical component 10 is represented by B, then (B/A)×100 is preferably greater than or equal to 5% and less than or equal to 30%. It should be noted that the projected area A is indicative of the area of the portion that would be bonded to the mounting substrate 16 in the case that the grooves 30 were not formed therein.

If the projected area B of the grooves 30 is too large, the adhesive strength between the transparent sealing member 20 and the mounting substrate 16 becomes small, and it becomes easy for the transparent sealing member 20 to come off or separate away from the mounting substrate 16. Conversely, if the projected area B of the groove 30 is too small, when the transparent sealing member 20 and the mounting substrate 16 are bonded to each other, it becomes difficult for the air bubbles 34 to escape from the grooves 30. Thus, as noted previously, the value of (B/A)×100 is preferably greater than or equal to 5% and less than or equal to 30%.

As shown in FIG. 1, the height hc (maximum depth) of the grooves 30 is preferably smaller than the thickness hd of the optical element 12. If the height hc of the grooves 30 is too large, the air bubbles 34 will remain around the periphery of the optical element 12 (refer to FIG. 3B). Moreover, if the height hc of the grooves 30 is too small, when the transparent sealing member 20 and the mounting substrate 16 are bonded to each other, it becomes difficult for the air bubbles 34 to escape from the grooves 30. When the thickness hd of the optical element 12 is from 100 to 1000 μm, the height hc of the grooves 30 is preferably from 50 to 600 μm.

Next, several modifications of the optical component 10 will be described with reference to FIGS. 6A through 11B.

At first, although having substantially the same configuration as the optical component 10 described above, as shown in FIGS. 6A and 6B, a first optical component 10A differs therefrom in that a frame-shaped step 40 that communicates with the concave portion 26 is formed around the periphery of the concave portion 26 within the portion of the transparent sealing member 20, the portion being bonded to the mounting substrate 16.

In this case, when the transparent sealing member 20 and the mounting substrate 16 are bonded to each other, the step 40 serves as a passage through which the air bubbles 34 are guided to the grooves 30, whereby it becomes possible for escape of the air bubbles 34 to the exterior to be smoothly carried out.

Figure 7:
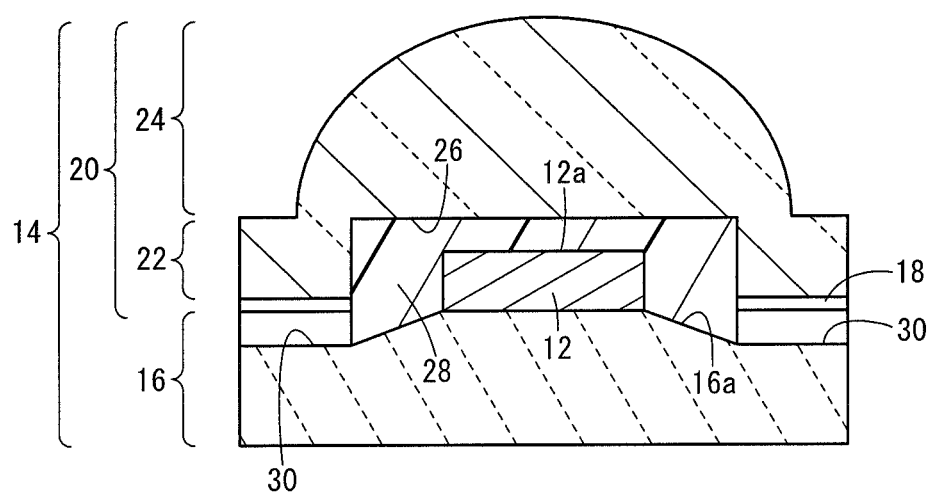
FIG. 7 is a vertical cross-sectional view showing a configuration of an optical component (second optical component) according to a second modification.

Next, a second optical component 10B has substantially the same configuration as the above-described optical component 10, but as shown in FIG. 7, differs therefrom in that the grooves 30 are formed in at least a portion within the mounting substrate 16, the portion being bonded to the transparent sealing member 20. More specifically, the second optical component 10B differs in that the grooves 30 do not exist in the transparent sealing member 20, but rather, the grooves 30 are formed in the mounting substrate 16. Within an upper surface 16a of the mounting substrate 16, the plurality of grooves 30 are formed to extend from the portion where the optical element 12 is mounted to the outer periphery of the mounting substrate 16. In this case as well, it is preferable for the plurality of grooves 30 to be formed radially (see FIGS. 2A to 2F).

In the second optical component 10B, when the transparent sealing member 20 and the mounting substrate 16 are bonded to each other, in a manner so as to bury the optical element 12 inside the concave portion 26 in which the refractive index matching agent 28 is filled, the portion of the refractive index matching agent 28 is easily discharged to the exterior through the grooves 30 that are formed in the mounting substrate 16, and escape of the air bubbles 34 to the exterior is also easily carried out.

Figure 8:
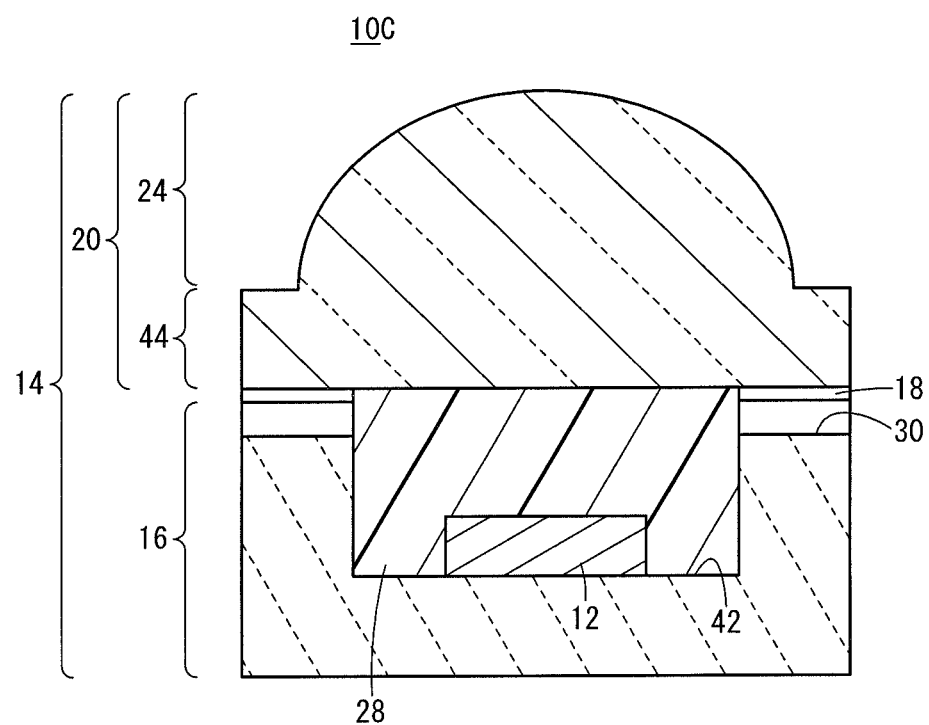
FIG. 8 is a vertical cross-sectional view showing a configuration of an optical component (third optical component) according to a third modification.

Next, a third optical component 10C has substantially the same configuration as the above-described optical component 10, but as shown in FIG. 8, differs therefrom in the following points. More specifically, the transparent sealing member 20 is formed integrally with the lens body 24, and a pedestal 44, the outer shape of which is, for example, of a rectangular shape or a circular shape. A concave portion 42 in which the optical element 12 is accommodated is formed not on the pedestal 44 of the transparent sealing member 20, but on the mounting substrate 16. More specifically, the mounting substrate 16 includes the concave portion 42 having an upper surface opening, and the optical element 12 is mounted on a bottom part of the concave portion 42. In addition, the plurality of grooves 30 are formed on a frame-shaped upper end part of the mounting substrate 16. In this case as well, it is preferable for the plurality of grooves 30 to be formed radially.

In the third optical component 10C, when the transparent sealing member 20 and the mounting substrate 16 are bonded to each other, in a manner so as to bury the optical element 12 inside the concave portion 42 in which the refractive index matching agent 28 is filled, the portion of the refractive index matching agent 28 is easily discharged to the exterior through the grooves 30 that are formed in the mounting substrate 16, and escape of the air bubbles 34 to the exterior is also easily carried out.

Figure 9:
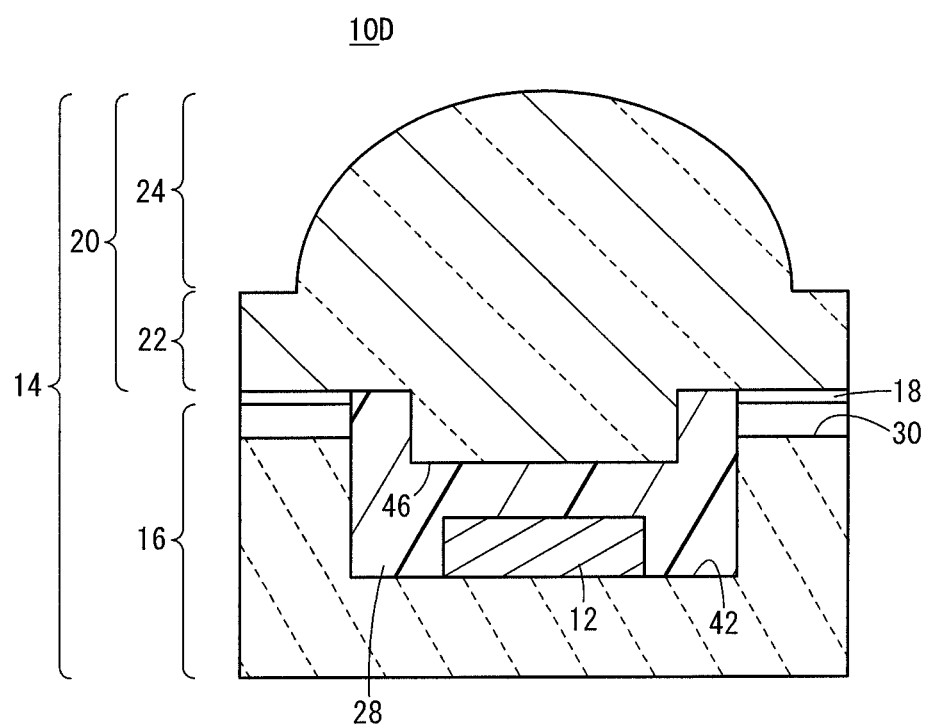
FIG. 9 is a vertical cross-sectional view showing a configuration of an optical component (fourth optical component) according to a fourth modification.

Next, a fourth optical component 10D has substantially the same configuration as the above-described third optical component 100, but as shown in FIG. 9, differs therefrom in that a bulging portion 46 is formed in the center of the lower surface of the pedestal 22. An area of the bulging portion 46 as viewed from a plane (i.e., in plan view) is smaller than the opening area of the concave portion 42 of the mounting substrate 16. In this case, more so than in the third optical component 10C, due to the fact that the refractive index matching agent 28 is moved laterally outward by a portion corresponding to the volume of the bulging portion 46, the air bubbles 34 are also easily moved outward, and the air bubbles 34 can be smoothly discharged to the exterior.

Figure 10A:
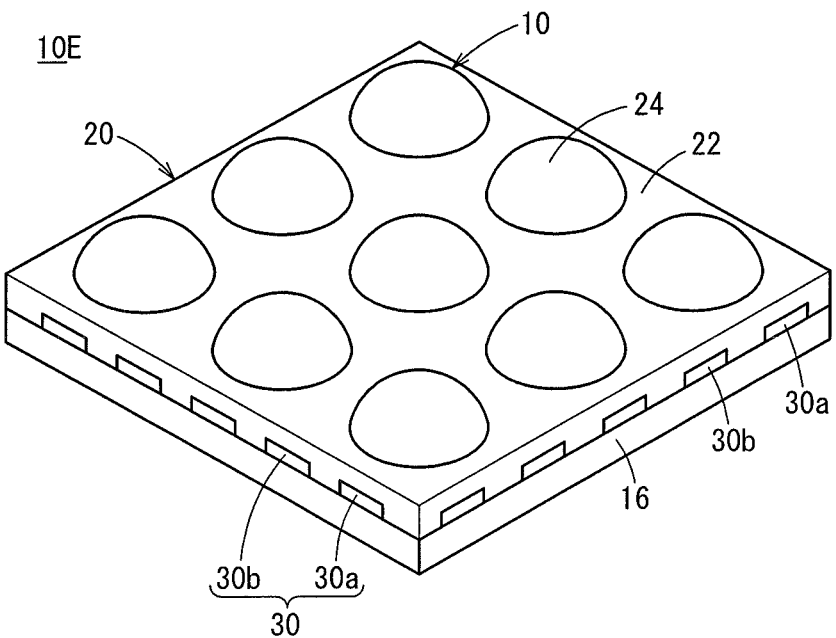
FIG. 10A is a perspective view showing a configuration of an optical component (fifth optical component) according to a fifth modification.
Figure 10B:
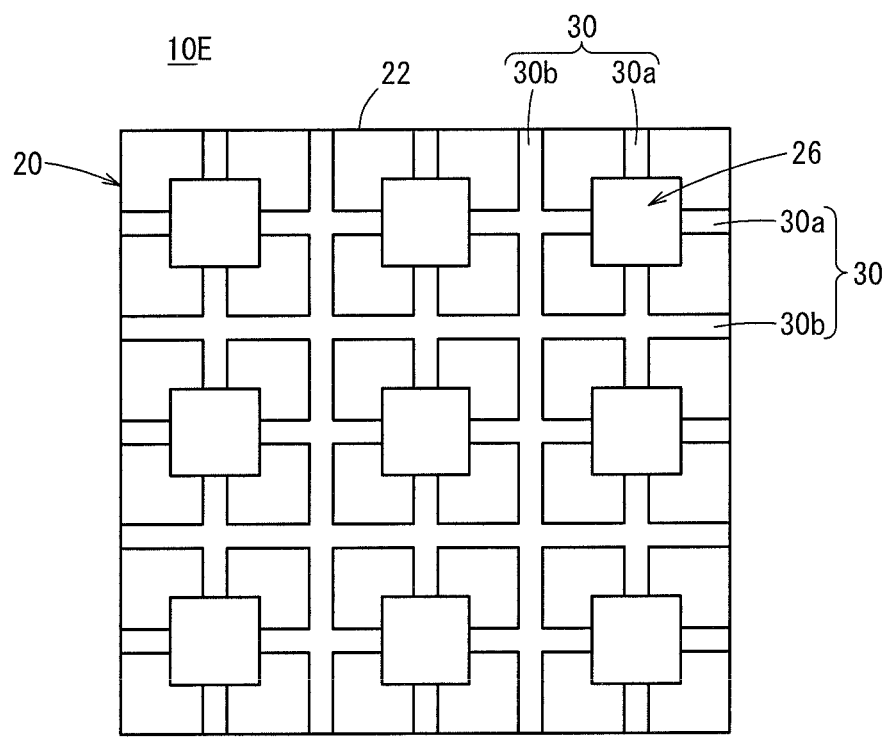
FIG. 10B is a plan view showing a bottom surface (bonding surface) of a transparent sealing member of the fifth optical component.

Next, as shown in FIGS. 10A and 10B, a fifth optical component 10E differs in that a plurality of the above-described optical components 10 are arranged in the form of an array.

The transparent sealing member 20 is configured in a manner so that a plurality of the lens bodies 24 are integrally arranged, for example, in the form of a matrix, on a single pedestal 22. Concave portions 26 (see FIG. 10B) corresponding to the lens bodies 24 are formed respectively in the pedestal 22. In addition, a plurality of the grooves 30 are formed in the portion within the pedestal 22, the portion being bonded to the mounting substrate 16.

In the plurality of grooves 30, in addition to a plurality of the first grooves 30a that communicate with the concave portions 26 of the transparent sealing member 20, there are included a plurality of the second grooves 30b that communicate between the first grooves 30a. The first grooves 30a and the second grooves 30b are formed up to the outer periphery of the pedestal 22, respectively.

Provisionally, in the case that the second grooves 30b were not formed, within the transparent sealing member 20, the discharging directions of any left over amount of the refractive index matching agent 28 flowing through the first grooves 30a in the vicinity of the center of the array would interfere with each other, and the flow of the refractive index matching agent 28 would be disrupted (become stagnant). As a result, it would become likely for the air bubbles 34 to remain in the concave portions 26 at portions where the flow is disrupted.

Thus, by providing the second grooves 30b, any left over amount of the refractive index matching agent 28 flowing through the first grooves 30a is discharged from each of the concave portions 26 of the transparent sealing member 20 through the second grooves 30b, and therefore, entry and mixing of the air bubbles 34 within the respective concave portions 26 can be suppressed.

Figure 11A:
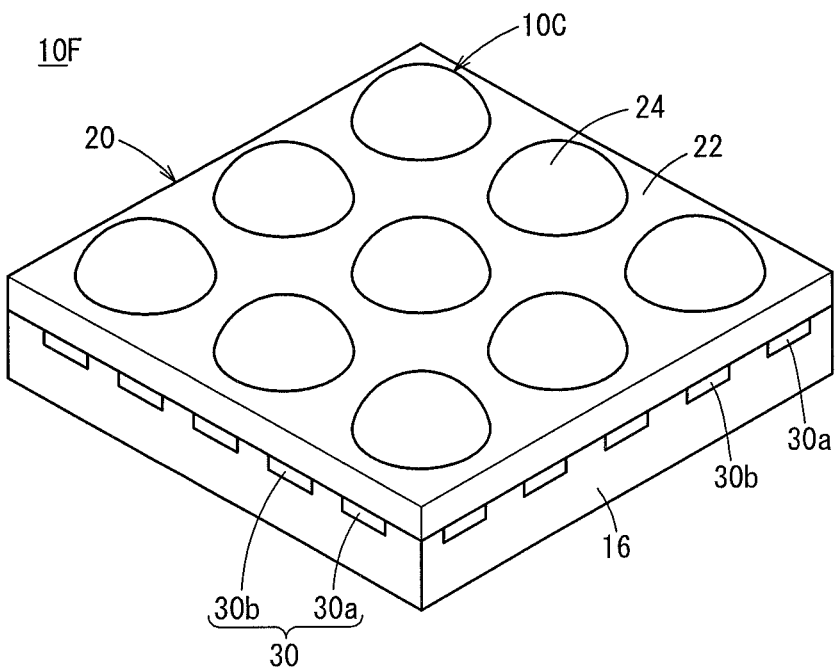
FIG. 11A is a perspective view showing a configuration of an optical component (sixth optical component) according to a sixth modification.
Figure 11B:
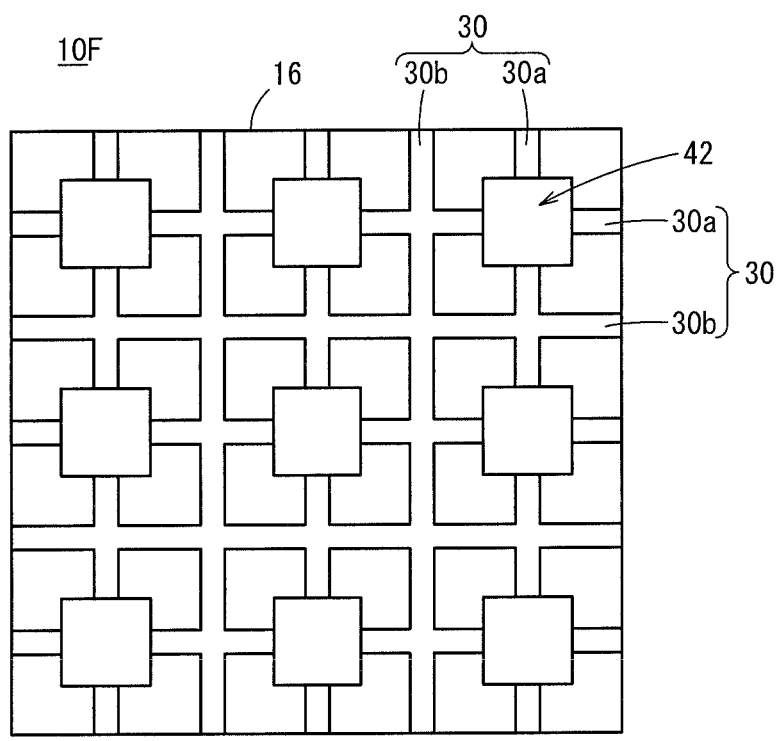
FIG. 11B is a plan view showing an upper surface (bonding surface) of a mounting substrate of the sixth optical component.

Next, as shown in FIGS. 11A and 11B, a sixth optical component 10F has substantially the same configuration as the above-described fifth optical component 10E, but differs therefrom in that, for example, a plurality of the third optical components 100 (see FIG. 8) are arranged in the form of an array.

The transparent sealing member 20 is configured in a manner so that a plurality of the lens bodies 24 are integrally arranged, for example, in the form of a matrix, on a single pedestal 22. Concave portions 42 (see FIG. 11B) corresponding to the lens bodies 24 are formed respectively in the mounting substrate 16. In addition, the plurality of grooves 30 are formed in the portion within the mounting substrate 16, the portion being bonded to the pedestal 22 of the transparent sealing member 20.

In this case as well, in the plurality of grooves 30, in addition to a plurality of the first grooves 30a that communicate with the concave portions 42 of the mounting substrate 16, there are included a plurality of the second grooves 30b that communicate between the first grooves 30a. The first grooves 30a and the second grooves 30b are formed up to the outer periphery of the mounting substrate 16, respectively.

Accordingly, in the sixth optical component 10F as well, since the second grooves 30b are provided, any left over amount of the refractive index matching agent 28 flowing through the first grooves 30a is discharged from the respective concave portions 42 of the mounting substrate 16 through the second grooves 30b, and therefore, entry and mixing of the air bubbles 34 within the respective concave portions 42 can be suppressed.

The optical component and the transparent sealing member according to the present invention are not limited to the above-described embodiments, and it is a matter of course that various configurations can be adopted therein without departing from the spirit and gist of the present invention.

The invention claimed is:
1. An optical component, comprising:
at least one optical element; and
a package in which the optical element is accommodated;

the package comprising:
a mounting substrate on which the optical element is mounted;
a transparent sealing member bonded on the mounting substrate;
a concave portion surrounding the optical element that is mounted on the mounting substrate; and
a refractive index matching agent filled inside the concave portion,
wherein the package includes at least one groove configured to communicate with an exterior from the concave portion, and
wherein a step configured to communicate with the concave portion is formed around a periphery of the concave portion, within a portion where the transparent sealing member and the mounting substrate are bonded to each other.

2. The optical component according to claim 1, wherein the groove is formed in the portion within the transparent sealing member, the portion being bonded to the mounting substrate.

3. The optical component according to claim 1, wherein the groove is formed in at least the portion within the mounting substrate, the portion being bonded to the transparent sealing member.

4. The optical component according to claim 1, comprising a plurality of the grooves, wherein the plurality of grooves are formed radially.

5. The optical component according to claim 1, wherein, assuming that a projected area of the portion where the transparent sealing member and the mounting substrate are bonded to each other with respect to a bottom surface of the optical component is represented by A, and a projected area of the groove with respect to the bottom surface of the optical component is represented by B, then (B/A)×100 is greater than or equal to 5% and less than or equal to 30%.

6. The optical component according to claim 1, wherein a height of the groove is smaller than a thickness of the optical element.

7. The optical component according to claim 1, wherein the transparent sealing member is made of quartz glass or optical glass, and the refractive index matching agent is a silicone resin or a fluorine resin.

8. A transparent sealing member used in an optical component comprising at least one optical element, a mounting substrate on which the optical element is mounted, and a concave portion surrounding the optical element that is mounted on the mounting substrate, the transparent sealing member constituting a package in which the optical element is accommodated together with the mounting substrate,
wherein the transparent sealing member:
is bonded to the mounting substrate in a state with a refractive index matching agent being filled in the concave portion; and
includes, in a portion that is bonded to the mounting substrate, at least one groove configured to communicate with an exterior from the concave portion, and
wherein a step configured to communicate with the concave portion is formed around a periphery of the concave portion, within the portion where the transparent sealing member is bonded to the mounting substrate.

9. The transparent sealing member according to claim 8, comprising a plurality of the grooves, wherein the plurality of grooves are formed radially.

10. The transparent sealing member according to claim 8, wherein, assuming that a projected area of the portion where the transparent sealing member is bonded to the mounting substrate with respect to a bottom surface of the optical component is represented by A, and a projected area of the groove with respect to the bottom surface of the optical component is represented by B, then (B/A)×100 is greater than or equal to 5% and less than or equal to 30%.

11. The transparent sealing member according to claim 8, wherein a height of the groove is smaller than a thickness of the optical element.

12. The transparent sealing member according to claim 8, wherein the transparent sealing member is made of quartz glass or optical glass, and the refractive index matching agent is a silicone resin or a fluorine resin.

13. An optical component, comprising:
at least one optical element; and
a package in which the optical element is accommodated;
the package comprising:
a mounting substrate on which the optical element is mounted;
a transparent sealing member bonded on the mounting substrate;
a concave portion formed in the transparent sealing member and surrounding the optical element; and
a refractive index matching agent filled inside the concave portion,
wherein the package includes at least one groove configured to communicate with an exterior from the concave portion, and
wherein the groove is formed in a portion within the transparent sealing member, the portion being a bottom surface of the transparent sealing member that is bonded to the mounting substrate.

14. The optical component according to claim 13, wherein a step configured to communicate with the concave portion is formed around a periphery of the concave portion, within the portion where the transparent sealing member and the mounting substrate are bonded to each other.

15. A transparent sealing member used in an optical component comprising at least one optical element, and a mounting substrate on which the optical element is mounted, the transparent sealing member constituting a package in which the optical element is accommodated together with the mounting substrate,
wherein the transparent sealing member includes:
a concave portion that surrounds the optical element and is filled with a refractive index matching agent when bonded to the mounting substrate; and
in a bottom surface portion of the transparent sealing member that is bonded to the mounting substrate, at least one groove configured to communicate with an exterior from the concave portion.

16. The transparent sealing member according to claim 15, wherein a step configured to communicate with the concave portion is formed around a periphery of the concave portion, within a portion of the transparent sealing member where the transparent sealing member is bonded to the mounting substrate.

* * * * *